(12) United States Patent
Oberle

(10) Patent No.: US 7,456,506 B2
(45) Date of Patent: *Nov. 25, 2008

(54) RADIO FREQUENCY IDENTIFICATION (RFID) TAG LAMINATION PROCESS USING LINER

(75) Inventor: Robert R. Oberle, Macungie, PA (US)

(73) Assignee: RCD Technology Inc., Quakertown, PA (US)

( * ) Notice: Subject to any disclaimer, the term of this patent is extended or adjusted under 35 U.S.C. 154(b) by 59 days.

This patent is subject to a terminal disclaimer.

(21) Appl. No.: 11/284,761

(22) Filed: Nov. 22, 2005

(65) Prior Publication Data

US 2006/0205115 A1   Sep. 14, 2006

Related U.S. Application Data

(63) Continuation-in-part of application No. 11/079,143, filed on Mar. 14, 2005.

(51) Int. Cl.
*H01L 23/48* (2006.01)
*H01L 21/00* (2006.01)
*G01V 15/00* (2006.01)

(52) U.S. Cl. ................ 257/784; 438/119; 343/760
(58) Field of Classification Search ............. 438/64, 438/119; 257/257, E21.506, 784, 785; 343/720, 343/760
See application file for complete search history.

(56) References Cited

U.S. PATENT DOCUMENTS

| | | | |
|---|---|---|---|
| 3,759,246 A | 9/1973 | Flack et al. |
| 5,058,161 A | 10/1991 | Weiss |
| 5,463,377 A | 10/1995 | Kronberg |
| 5,598,032 A | 1/1997 | Fidalgo |
| 5,629,981 A | 5/1997 | Nerlikar |
| 5,786,626 A | 7/1998 | Brady et al. |
| 5,874,902 A | 2/1999 | Heinrich et al. |
| 5,892,611 A | 4/1999 | Iisuka |
| 5,942,978 A | 8/1999 | Shafer |
| 5,963,134 A | 10/1999 | Bowers et al. |
| 6,049,461 A | 4/2000 | Haghiri-Tehrani et al. |
| 6,089,284 A | 7/2000 | Kaehler et al. |
| 6,111,520 A | 8/2000 | Allen et al. |
| 6,130,623 A | 10/2000 | MacLellan et al. |
| 6,133,833 A | 10/2000 | Sidlauskas et al. |
| 6,147,662 A * | 11/2000 | Grabau et al. ............. 343/895 |
| 6,204,760 B1 | 3/2001 | Brunius |
| 6,206,292 B1 | 3/2001 | Robertz et al. |
| 6,265,977 B1 | 7/2001 | Vega et al. |
| 6,400,323 B2 | 6/2002 | Yasukawa et al. |
| 6,421,013 B1 | 7/2002 | Chung |

(Continued)

FOREIGN PATENT DOCUMENTS

EP   0 903 805 A2   3/1999

OTHER PUBLICATIONS

PCT International Search Report dated Apr. 29, 2008 in connection with Application No. PCT/US06/60922.

*Primary Examiner*—W. David Coleman
(74) *Attorney, Agent, or Firm*—Fliesler Meyer LLP

(57) ABSTRACT

A method of constructing an RFID unit can include using a protective layer to hold an integrated circuit chip module to a substrate layer with an antenna unit while a conductive adhesive has not yet fully set.

25 Claims, 3 Drawing Sheets

U.S. PATENT DOCUMENTS

| | | |
|---|---|---|
| 6,514,790 B1 | 2/2003 | Plettner et al. |
| 6,696,952 B2 | 2/2004 | Zirbes |
| 6,774,800 B2 | 8/2004 | Friedman et al. |
| 6,849,936 B1 | 2/2005 | Berman et al. |
| 2002/0053735 A1 | 5/2002 | Neuhaus et al. |
| 2002/0140608 A1 | 10/2002 | Zaghloul et al. |
| 2003/0116790 A1 | 6/2003 | Kokuchi et al. |
| 2004/0070510 A1 | 4/2004 | Zhang et al. |
| 2005/0128086 A1 | 6/2005 | Brown et al. |
| 2005/0252605 A1 | 11/2005 | Green et al. |

* cited by examiner

RADIO FREQUENCY IDENTIFICATION (RFID) TAG LAMINATION PROCESS USING LINER

CLAIM OF PRIORITY

This application is a continuation in part of U.S. application Ser. No. 11/079,143 entitled "Radio Frequency Identification (RFID) Tag Lamination Process" by Robert R. Oberle, filed Mar. 14, 2005.

BACKGROUND OF INVENTION

Radio Frequency Identification (RFID) tags are typically small objects that can be attached to or incorporated into a product. RFID tags contain antenna to enable them to receive and respond to radio-frequency queries from an RFID tranciever. The RFID tags are used in a host of industries for purposes such as inventory control, security, personal identification and the like.

The RFID tags can be passive or active. Active devices have their own power supply. Passive devices rely on energization from the RFID tranciever. Passive and active RFID tags can use integrated circuit chips to modulate the identification response.

The construction of RFID units can consist of the attachment of a chip module to a substrate with an antenna unit. The chip module is typically attached to the substrate with an electrically conductive adhesive and then the combined unit can be further processed after the adhesive sets.

DETAILED DESCRIPTION

One embodiment of the present invention comprises a method of constructing an RFID unit. The method comprises attaching an integrated circuit chip to a substrate with an antenna unit using an adhesive; and laminating a protective layer over at least a portion of the integrated circuit chip while the adhesive has not yet fully set.

Figure 1:
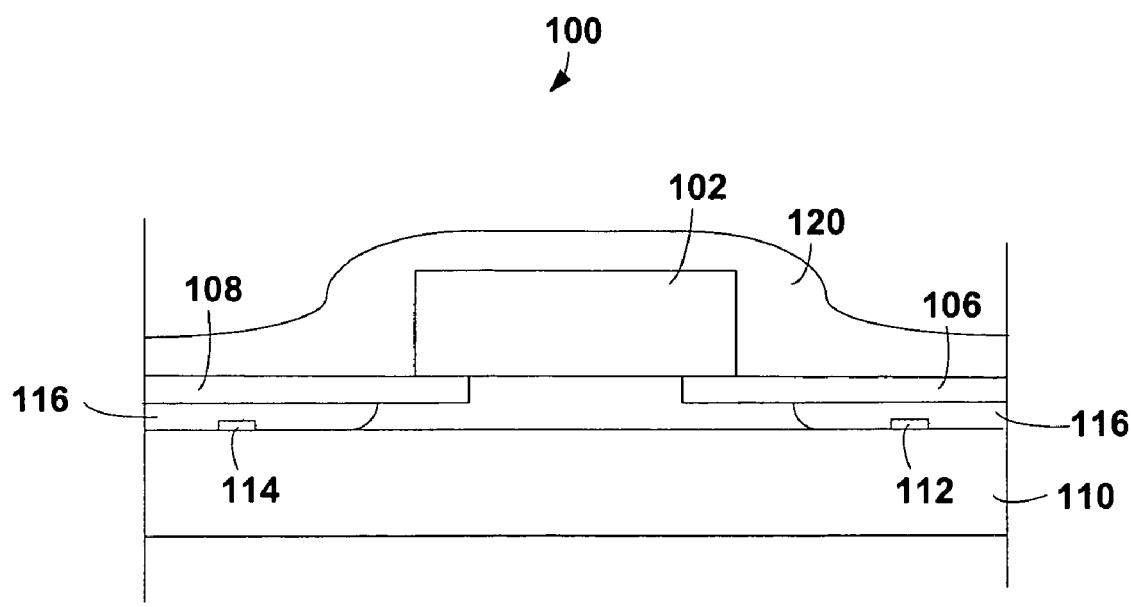
FIG. 1 is a cross sectional view of an RFID unit of one embodiment.

FIG. 1 illustrates a cross section diagram of an RFID unit 100 of one embodiment. In this embodiment, the integrated circuit 102 is part of a module 104 which also includes lead frame elements 106 and 108. Other connection elements other than a lead frame could be used in the module 104. The module 104 is adhesively connected to substrate 110 including antenna elements 112 and 114 using a conductive adhesive 116. The conductive adhesive 116 can be a conventional isotropic conductive adhesive, and anisotropic conductive adhesive or even solder such as solder paste.

Figure 2:
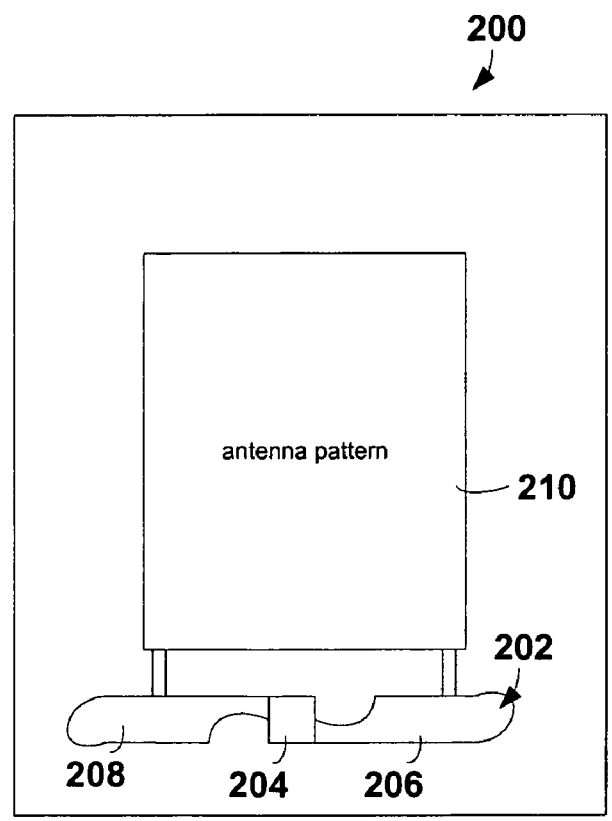
FIG. 2 is a top view of an RFID unit of one embodiment.

FIG. 2 illustrates a top view where module 202 with IC 204 and lead frame 206 and 208 are connected using the conductive adhesive to the antenna unit 210 to form the RFID unit 200.

Looking again at FIG. 1, the protective layer 120 can be laminated over the module 104 including the integrated circuit 102. The protective layer 120 can hold the module 102 in place while the conductive adhesive 116 sets.

The laminating protective layer can be made of many type of materials including thermoplastic material, thermoset material, polyester, polystyrene, polypropylene, polyethylene. The protective layer may have an adhesive layer. In one embodiment, the protective layer is relatively stretchy and will conform the shape of the module or integrated circuit chip. In one embodiment, since the lamination is done before the adhesive is fully set, there does not have to be any dwell time between attaching and laminating steps. In one embodiment, the dwell time can be reduced below a minute. The attachment step can be done at a high rate due to the lack of requirement for the conductive adhesive to fully set. In one embodiment, the attachment is done at a rate of one attachment per second or greater. The conductive adhesive can be of such that it takes a long time to fully set since the protective layer holds the module in place. Thus, the conductive adhesive can take over a day to fully set, which can greatly increase the pot time of the adhesive in the apparatus to produce the RFID units. In one embodiment, the conductive adhesive can take over a hour to fully set.

The protective layer can have a radiation or heat curable adhesive. In one embodiment, the protective layer has an ultra violet (UV) curable adhesive that can be cured in a later step.

Figure 3:
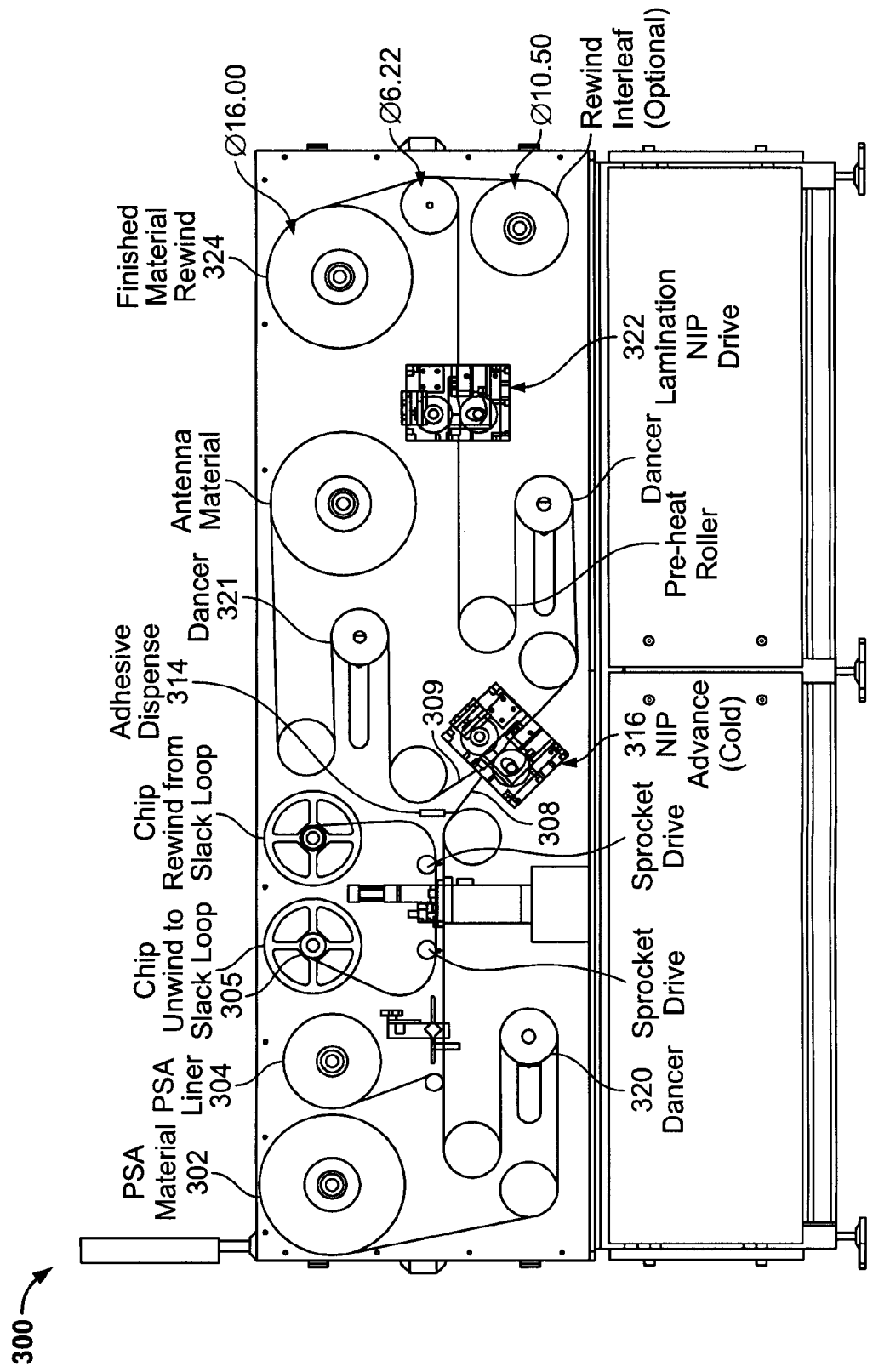
FIG. 3 is a diagram of an apparatus to construct an RFID unit of one embodiment.

FIG. 3 illustrates an apparatus of one embodiment. In this embodiment, the laminating protective layer is held in a strip on roll 302. If the protective layer has a liner it can be removed onto roll 304. A roll 305 containing a strip with chip modules can feed to device 307 which can attached the chip module up side down on the protective layer 308. The antenna material can be a strip on roll 310. The conductive adhesive can be provided by an adhesive dispenser 314 to dispense upon module, such as on the leadframe of the module. An attachment unit 316 attaches the protective layer 308 with modules to the antenna material strip 309. Dancers 320 and 321 can be used to register the substrate strip having antenna units with the modules on the protective layer 308. A lamination unit 322 can later be used to laminate the protective layer over the integrated circuit chip module. The finished material can be rolled up into a roll 324 which can be held for later processing. The later processing can include cure step which can be done at a separate location from the apparatus 300. The laminating unit 322 can use hot rollers. The attaching unit 316 can operate at a rate greater than one attachment per second or greater.

In the example of FIG. 3, the integrated circuit chip (as part of the chip module) is attached to the protective layer before the attaching unit. This need not be the case, but it can allow the chips to be spaced on a strip such that the chips will register in position with the substrate strip having the antenna unit. In an alternate embodiment, the integrated circuit chip, as part of the chip module, is attached to the substrate with antenna first followed by the lamination of the protective layer.

Figure 4A:
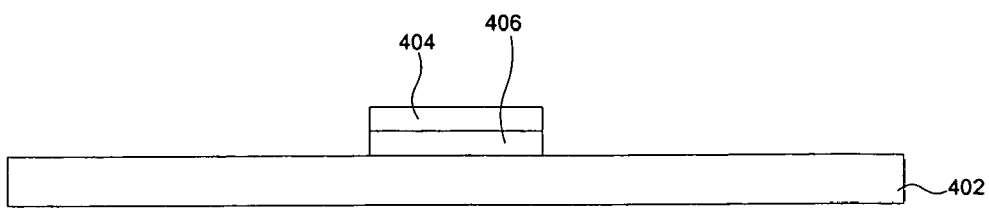
FIG. 4 shows an example of a system using liners.
Figure 4B:
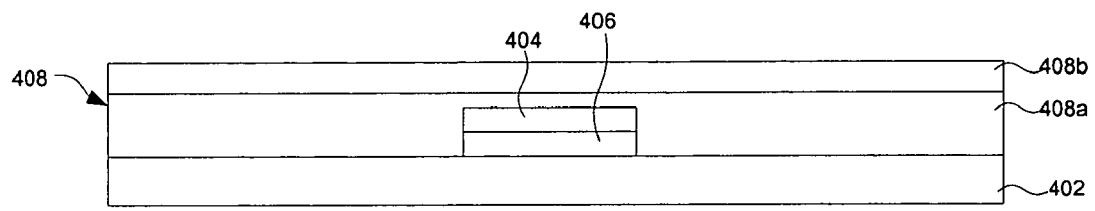
Figure 4C:
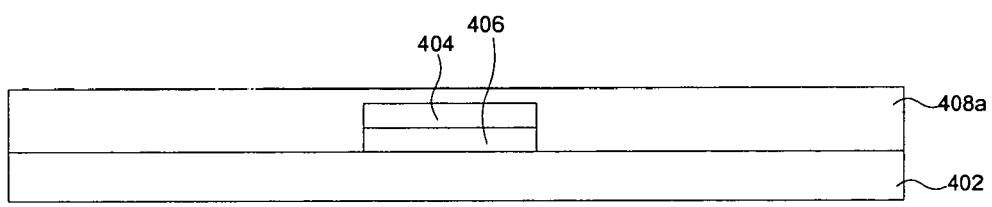

FIG. 4 shows an example of a system using liners. In FIG. 4A, an integrated circuit chip 404 is attached to a substrate 402 using adhesive 406 as shown in FIG. 4B. A protective layer 408 can be laminated over the integrated circuit chip 404 before the adhesive 406 sets. The protective layer can include a liner 408b and second adhesive 408a. The second adhesive 408a can be a thermaset, hot melt, heat activated, pressure sensitive, or other type of adhesive. The liner 408b can be removed as shown in FIG. 4C.

The protective layer can also be an uncured two-part adhesive, such as an epoxy like polyurethane. The two-part adhesive can be attached to the liner then placed over the substrate with attached IC. The two-part adhesive can then be cured to form an encapsulated RFID device, such as a credit or identification card.

The protective layer adhesive can be used to attach the unit to another element, such as a box or product for RFID tracking. In one embodiment, the unit acts acts as a label that can be attached to the element. There can be printed indicia, such as for the label, on one side of the substrate.

One embodiment of the present invention is a method of constructing an RFID unit comprising using a conductive adhesive to attach an integrated circuit chip module to a substrate with an antenna unit; and laminating a protective layer over at least a part of the integrated circuit chip module while the conductive adhesive has not yet fully set.

One embodiment of the present invention is a method of constructing an RFID unit comprising placing a integrated circuit chip module on a protective layer, wherein the protective layer includes an adhesive to hold the integrated circuit module; placing a conductive adhesive on at least portions of the integrated circuit chip module; and attaching the integrated circuit chip module to a substrate with an antenna unit.

One embodiment of the present invention is an RFID unit comprising a substrate with an antenna unit; an integrated circuit chip to the substrate with an antenna unit using an adhesive; and a protective layer laminated over at least a part of the integrated circuit chip while the adhesive has not yet fully set.

The chip module can be a single chip attached to a lead frame or suitable substrate with appropriate electrical connections for attachment to the antenna-examples of chip modules are offered by Philips Electronics, Netherlands (FCP package) and Alien Technologies of Morgan Hill, Calif. (Alien Strap) The lead frame can terminates in two pads, which are intended to attach to the RFID circuit by a conductive adhesive. Chip modules can be utilized in order to alleviate the difficulties that normally arise when placing a small integrated circuits (typical integrated circuits are <1 mm square, and the areal density of integrated circuits are typically very low, <0.25 units/square inch). In traditional application, the mounting of small integrated circuits without a leadframe leads to low process throughput owing to the time delay inherent in locating and placing such a small integrated circuit.

The disadvantages of previous processes relate to process throughput and reliability. Application of non-conductive epoxy under the integrated circuit and conductive epoxy to the outer leads results in a mechanically and electrically reliable assembly, however the dwell time for the circuit, i.e. that time that the circuit must be immobilized while the adhesives cure is typically several minutes. This may be decreased by using faster curing epoxy resins however the inherent chemical instability of so-called snap cure resins makes handling difficult and leads to excessive yield loss or high material wastage. Anisotropic adhesives, either tapes or pastes offer increased throughput with respect to epoxy adhesives however the dwell time per attachment is typically several seconds and during the dwell time the module must be held immobile on the substrate using considerable pressure to effect a reliable electrical connection. The use of a laminated protective layer can produce a throughput in excess of one attachment per second that insures mechanical stability of the device. The equipment can be relatively simple to maintain a very low cost of ownership of the overall process. This can be as low as $0.01 or less per attachment when considering the overall cost of materials and equipment amortization.

In one embodiment, a traditional conductive adhesive can be placed over the terminals of the circuit to which the module is to be attached or placed on the terminals of the module prior to assembly.

The module can be placed on the substrate with contact of the terminals of the module on the appropriate terminal of the circuit. Alternatively, the module may be temporarily attached to a tape which is subsequently laminated to the circuit.

A protective layer can be laminated over the module of a tape which holds the module in place while the adhesive is cured (partially or fully). The tape may held in place by a variety of adhesives including an adhesive selected from any of a number of adhesive types; hot melt, pressure sensitive, UV cure, thermoset etc. This laminate may cover the module fully or partially or it may be advantageous to use a segmented or multiple adhesives for specific uses.

A curing step can be done to set, such as cure, the conductive adhesive. This step may be of a type that initiates cure of the adhesive which proceeds after the circuit has been removed from the immediate vicinity of the attachment and/or curing station.

The protective layer can form a protective cover for the module, particularly if the laminate conforms closely to the shape of the module after lamination. There is no requirement for dwell time in the placement equipment. This means that parts with a partially cured adhesive can be safely rolled up and stored while the curing process takes place. This has the dual benefit of increasing process throughput and reducing material waste costs. Tape lamination equipment presently available can be modified to suit this application. The throughput of exiting equipment is sufficient to meet the imperative of a low cost high throughput process for placement and attachment of the module.

In alternate embodiments, a curable adhesive can be placed over the module contemporaneously with the conductive adhesive; an anisotropic adhesive can be used rather than traditional conductive adhesive; and/or an anisotropic adhesive can be used in place of both the traditional conductive adhesive and a laminating adhesive.

An alternate embodiment is a method for constructing a flexible circuit comprising attaching an integrated circuit chip to a substrate with an circuit traces using an adhesive; and laminating a protective layer over at least part of the integrated circuit chip while the adhesive has not yet fully set.

The foregoing description of preferred embodiments of the present invention has been provided for the purposes of illustration and description. It is not intended to be exhaustive or to limit the invention to the precise forms disclosed. Many embodiments were chosen and described in order to best explain the principles of the invention and its practical application, thereby enabling others skilled in the art to understand the invention for various embodiments and with various modifications that are suited to the particular use contemplated. It is intended that the scope of the invention be defined by the claims and their equivalents.

What is claimed is:

1. An apparatus to construct an RFID unit comprising:
   a unit to attach an integrated circuit chip to a substrate with an antenna unit using an electrically conductive adhesive; and
   a unit to laminate a protective layer with a liner over at least part of the integrated circuit chip while the electrically conductive adhesive has not yet fully set.

2. The apparatus of claim 1, wherein the integrated circuit chip is part of a chip module.

3. The apparatus of claim 1, wherein the laminating unit connects a strip of the protective layer to a strip of the substrate.

4. The apparatus of claim 1, wherein the laminating unit uses hot rollers.

5. The apparatus of claim 1, wherein the attaching unit operates at a rate of one attachment per second or greater.

6. The apparatus of claim 1, wherein the integrated circuit chip is attached to the protective layer before the attaching unit.

7. The apparatus of claim 1, wherein the liner is removed.

8. A method of constructing a flexible circuit comprising:
attaching an integrated circuit chip to a substrate with an circuit traces using an electrically conductive adhesive;
laminating a protective layer with a liner over at least part of the integrated circuit chip while the electrically conductive adhesive has not yet fully set; and
removing the liner from the protective layer.

9. A method of constructing an RFID unit comprising:
attaching an integrated circuit chip to a substrate with an antenna unit using an electrically conductive adhesive;
laminating a protective layer with a liner over at least part of the integrated circuit chip while the electrically conductive adhesive has not yet fully set; and
removing the liner from the protective layer.

10. The method of claim 9, wherein the integrated circuit chip is part of a chip module.

11. The method of claim 9, wherein any dwell time between the attaching and laminating steps is less than less than minute.

12. The method of claim 9, wherein the attachment step is done at a rate of one attachment per second or greater.

13. The method of claim 9, wherein the adhesive takes over a hour to fUlly set.

14. The method of claim 9, wherein the conductive adhesive is solder paste.

15. The method of claim 9, wherein the integrated circuit chip is attached to the protective layer before the attaching step.

16. The method of claim 9, wherein the protective layer is stretchy to conform to IC chip.

17. The method of claim 9, wherein the protective layer is an adhesive.

18. The method of claim 9, wherein there is printed indicia on one side of the substrate.

19. The method of claim 10, wherein the chip module includes a lead frame.

20. The method of claim 10, wherein attaching step comprises using the adhesive to connect a connection element of the module to the antenna unit on the substrate.

21. The method of claim 17, wherein the protective layer is a pressure sensitive adhesive.

22. The method of claim 17, wherein the protective layer is a hot melt adhesive.

23. The method of claim 17, wherein the protective layer is a heat activated adhesive.

24. The method of claim 17, wherein the protective layer is an uncured two-part adhesive.

25. The method of claim 17, wherein the protective layer adhesive is attached to another element.

* * * * *

UNITED STATES PATENT AND TRADEMARK OFFICE
CERTIFICATE OF CORRECTION

PATENT NO.      : 7,456,506 B2
APPLICATION NO. : 11/284761
DATED           : November 25, 2008
INVENTOR(S)     : Robert R. Oberle It is certified that error appears in the above-identified patent and that said Letters Patent is hereby corrected as shown below:

Delete claims 1-25 in the issued patent and replace with the allowed claims 1-25, as shown below:

Col. 4, Line 58 Claim 1. A method of constructing an RFID unit comprising:
   attaching an integrated circuit chip to a substrate with an antenna unit using an electrically conductive adhesive;
   laminating a protective layer with a liner over at least part of the integrated circuit chip while the electrically conductive adhesive has not yet fully set; and
   removing the liner from the protective layer.

Col. 4, Line 66 Claim 2. The method of claim 1, wherein the integrated circuit chip is part of a chip module.

Col. 5, Lines 1-3 Claim 3. The method of claim 2, wherein the chip module includes a lead frame.

Col. 5, Lines 4-5 Claim 4. The method of claim 2, wherein attaching step comprises using the adhesive to connect a connection element of the module to the antenna unit on the substrate.

Col. 5, Lines 6-7 Claim 5. The method of claim 1, wherein any dwell time between the attaching and laminating steps is less than less than minute.

Col. 5, Line 8 Claim 6. The method of claim 1, wherein the attachment step is done at a rate of one attachment per second or greater.

Col. 5, Line 11 Claim 7. The method of claim 1, wherein the adhesive takes over a hour to fully set.

Col. 5, Line 12 Claim 8. The method of claim 1, wherein the conductive adhesive is solder paste.

Col. 5, Lines 20-21 Claim 9. The method of claim 1, wherein the integrated circuit chip is attached to the protective layer before the attaching step.

Col. 5, Lines 27-28 Claim 10. The method of claim 1, wherein the protective layer is stretchy to conform to IC chip.

Col. 5, Lines 29-30 Claim 11. The method of claim 1, wherein the protective layer is an adhesive.

UNITED STATES PATENT AND TRADEMARK OFFICE
CERTIFICATE OF CORRECTION

PATENT NO. : 7,456,506 B2
APPLICATION NO. : 11/284761
DATED : November 25, 2008
INVENTOR(S) : Robert R. Oberle It is certified that error appears in the above-identified patent and that said Letters Patent is hereby corrected as shown below:

Col. 6, Lines 1-2 Claim 12. The method of claim 12, wherein the protective layer is a pressure sensitive adhesive.

Col. 6, Lines 3-4 Claim 13. The method of claim 12, wherein the protective layer is a hot melt adhesive.

Col. 6, Lines 5-6 Claim 14. The method of claim 12, wherein the protective layer is a heat activated adhesive.

Col. 6, Lines 7-8 Claim 15. The method of claim 12, wherein the protective layer is an uncured two-part adhesive.

Col. 6, Lines 10-11 Claim 16. The method of claim 12, wherein the protective layer adhesive is attached to another element.

Col. 6, Lines 12-13 Claim 17. The method of claim 1, wherein there is printed indicia on one side of the substrate.

Col. 6, Lines 14-18 Claim 18. An apparatus to construct an RFID unit comprising:
    a unit to attach an integrated circuit chip to a substrate with an antenna unit using an electrically conductive adhesive; and
    a unit to laminate a protective layer with a liner over at least part of the integrated circuit chip while the electrically conductive adhesive has not yet fully set.

Col. 6, Line 19 Claim 19. The apparatus of claim 19, wherein the integrated circuit chip is part of a chip module.

Col. 6, Lines 20-21 Claim 20. The apparatus of claim 19, wherein the laminating unit connects a strip of the protective layer to a strip of the substrate.

Col. 6 Lines 22-23 Claim 21. The apparatus of claim 19, wherein the laminating unit uses hot rollers.

Col. 6, Lines 24-25 Claim 22. The apparatus of claim 19, wherein the attaching unit operates at a rate of one attachment per second or greater.

Col. 6, Lines 26-27 Claim 23. The apparatus of claim 19, wherein the integrated circuit chip is attached to the protective layer before the attaching unit.

UNITED STATES PATENT AND TRADEMARK OFFICE
CERTIFICATE OF CORRECTION

PATENT NO. : 7,456,506 B2
APPLICATION NO. : 11/284761
DATED : November 25, 2008
INVENTOR(S) : Robert R. Oberle It is certified that error appears in the above-identified patent and that said Letters Patent is hereby corrected as shown below:

Col. 6, Line 28 Claim 24. The apparatus of claim 19, wherein the liner is removed.

Col. 6, Lines 29-34 Claim 25. A method of constructing a flexible circuit comprising:
    attaching an integrated circuit chip to a substrate with an circuit traces using an electrically conductive adhesive;
    laminating a protective layer with a liner over at least part of the integrated circuit chip while the electrically conductive adhesive has not yet fully set; and
    removing the liner from the protective layer.

Signed and Sealed this

Eleventh Day of August, 2009

David J. Kappos
*Director of the United States Patent and Trademark Office*